United States Patent
Smith et al.

(10) Patent No.: US 12,020,960 B2
(45) Date of Patent: Jun. 25, 2024

(54) DETERMINING AND CONTROLLING SUBSTRATE TEMPERATURE DURING SUBSTRATE PROCESSING

(71) Applicant: LAM RESEARCH CORPORATION, Fremont, CA (US)

(72) Inventors: Jeremy George Smith, Hayward, CA (US); Eric A. Pape, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 791 days.

(21) Appl. No.: 17/045,887

(22) PCT Filed: Apr. 8, 2019

(86) PCT No.: PCT/US2019/026276
§ 371 (c)(1),
(2) Date: Oct. 7, 2020

(87) PCT Pub. No.: WO2019/199641
PCT Pub. Date: Oct. 17, 2019

(65) Prior Publication Data
US 2021/0143037 A1    May 13, 2021

Related U.S. Application Data (60) Provisional application No. 62/656,647, filed on Apr. 12, 2018.

(51) Int. Cl.
*H01L 21/67* (2006.01)
*G05B 17/02* (2006.01)
*H01L 21/687* (2006.01)

(52) U.S. Cl.
CPC ........ *H01L 21/67248* (2013.01); *G05B 17/02* (2013.01); *H01L 21/67109* (2013.01); *H01L 21/68771* (2013.01)

(58) Field of Classification Search
CPC ......... H01L 21/67248; H01L 21/67109; H01L 21/68714; H01L 21/68771; G05B 17/02
See application file for complete search history.

(56) References Cited

U.S. PATENT DOCUMENTS

| 5,547,539 A | 8/1996 | Arasawa et al. |
| 5,622,593 A | 4/1997 | Arasawa et al. |

(Continued)

FOREIGN PATENT DOCUMENTS

| CN | 1956143 A | * | 5/2007 | ........ H01J 37/32091 |
| JP | H11507473 A | | 6/1999 | |

(Continued)

OTHER PUBLICATIONS

International Search Report and Written Opinion of the ISA issued in PCT/US2019/026276, dated Jul. 26, 2019; ISA/KR.

*Primary Examiner* — Mark A Connolly (57) ABSTRACT

A temperature controller for substrate processing system includes memory that stores a temperature control model that correlates a heat transfer gas pressure and a first temperature of a substrate support to a second temperature of a substrate arranged on the substrate support, a temperature calculation module configured to calculate the second temperature of the substrate using the heat transfer gas pressure, the first temperature of the substrate support, and the temperature control model, and a heat transfer gas control module configured to adjust the heat transfer gas pressure based on the second temperature of the substrate calculated by the temperature calculation module and a desired third temperature of the substrate.

20 Claims, 8 Drawing Sheets

(56) References Cited

U.S. PATENT DOCUMENTS

| | | | |
|---|---|---|---|
| RE36,810 E | 8/2000 | Arasawa et al. | |
| 6,303,895 B1 | 10/2001 | Husain et al. | |
| 6,320,736 B1 * | 11/2001 | Shamouilian | C23C 16/4586 |
| | | | 361/115 |
| 2008/0102209 A1 | 5/2008 | Sasaki et al. | |
| 2015/0060013 A1 | 3/2015 | Buchberger, Jr. | |
| 2016/0372352 A1 | 12/2016 | Wu et al. | |

FOREIGN PATENT DOCUMENTS

| | | |
|---|---|---|
| JP | 2009512193 A | 3/2009 |
| KR | 100313028 B1 | 3/2002 |
| WO | WO-199641369 A1 | 12/1996 |
| WO | WO-2007041668 A1 | 4/2007 |
| WO | WO-2015004804 A1 | 1/2015 |

* cited by examiner

DETERMINING AND CONTROLLING SUBSTRATE TEMPERATURE DURING SUBSTRATE PROCESSING

CROSS-REFERENCE TO RELATED APPLICATIONS

This application is a U.S. National Phase Application under 35 U.S.C. 371 of International Application No. PCT/US2019/023987, filed on Apr. 8, 2019, which claims the benefit of U.S. Provisional Application No. 62/656,647, filed on Apr. 12, 2018. The present disclosure is related to U.S. patent application Ser. No. 15/824,447, filed on Nov. 28, 2017, which claims the benefit of U.S. Provisional Application No. 62/434,665, filed on Dec. 15, 2016. The entire disclosures of the applications referenced above are incorporated herein by reference.

FIELD

The present disclosure relates to estimating and controlling temperature of a substrate in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, dielectric etch, and/or other etch, deposition, or cleaning processes. A substrate may be arranged on a substrate support, such as a pedestal, an electrostatic chuck (ESC), etc. in a processing chamber of the substrate processing system. During etching, etch gas mixtures including one or more gases may be introduced into the processing chamber and plasma may be used to initiate chemical reactions.

The substrate support may include a ceramic layer arranged to support a substrate. For example, the substrate may be clamped to the ceramic layer during processing. The substrate support may include a plurality of channels to provide a heat transfer gas (e.g., helium) to a backside of the substrate arranged on the ceramic layer. The heat transfer gas facilitates cooling of the substrate and/or the ceramic layer.

SUMMARY

A temperature controller for substrate processing system includes memory that stores a temperature control model that correlates a heat transfer gas pressure and a first temperature of a substrate support to a second temperature of a substrate arranged on the substrate support, a temperature calculation module configured to calculate the second temperature of the substrate using the heat transfer gas pressure, the first temperature of the substrate support, and the temperature control model, and a heat transfer gas control module configured to adjust the heat transfer gas pressure based on the second temperature of the substrate calculated by the temperature calculation module and a desired third temperature of the substrate.

In other features, the substrate support includes a plurality of zones and the first temperature of the substrate support corresponds to respective temperatures in each of the plurality of zones. The second temperature of the substrate corresponds to a plurality of substrate temperatures and the plurality of substrate temperatures corresponds to the plurality of zones of the substrate support. To adjust the heat transfer gas pressure, the heat transfer gas control module is configured to adjust a plurality of pressure controllers and each of the plurality of pressure controllers corresponds to one of the plurality of zones of the substrate support.

In other features, the desired third temperature of the substrate corresponds to a recipe setpoint. The temperature calculation module is configured to receive the desired third temperature from a user interface. The temperature calculation module is configured to provide the second temperature of the substrate to a display.

In other features, the temperature control model is configured to calculate the heat transfer gas pressure based on a relationship between a controlled heat transfer gas pressure and an actual heat transfer gas pressure between the substrate and the substrate support. To calculate the second temperature of the substrate, the temperature calculation module is configured to (i) using a heat transfer gas pressure model, calculate the actual heat transfer gas pressure based on the controlled heat transfer gas pressure and (ii) calculate the second temperature of the substrate based on the actual heat transfer gas pressure and the first temperature of the substrate support. To calculate the second temperature of the substrate, the temperature calculation module is configured to (i) receive the heat transfer gas pressure from a pressure sensor arranged within the substrate support and (ii) calculate the second temperature of the substrate based on the heat transfer gas pressure received from the pressure sensor.

A method for controlling temperature of a substrate support in a substrate processing system includes storing, in memory, a temperature control model that correlates a heat transfer gas pressure and a first temperature of a substrate support to a second temperature of a substrate arranged on the substrate support, calculating the second temperature of the substrate using the heat transfer gas pressure, the first temperature of the substrate support, and the temperature control model, and adjusting the heat transfer gas pressure based on the calculated second temperature of the substrate and a desired third temperature of the substrate.

In other features, the substrate support includes a plurality of zones and the first temperature of the substrate support corresponds to respective temperatures in each of the plurality of zones. The second temperature of the substrate corresponds to a plurality of substrate temperatures and the plurality of substrate temperatures corresponds to the plurality of zones of the substrate support. Adjusting the heat transfer gas pressure includes adjusting a plurality of pressure controllers and each of the plurality of pressure controllers corresponds to one of the plurality of zones of the substrate support.

In other features, the desired third temperature of the substrate corresponds to a recipe setpoint. The method further includes receiving the desired third temperature from a user interface. The method further includes providing the second temperature of the substrate to a display.

In other features, the method further includes calculating the heat transfer gas pressure based on a relationship between a controlled heat transfer gas pressure and an actual heat transfer gas pressure between the substrate and the substrate support. Calculating the second temperature of the substrate includes (i) using a heat transfer gas pressure model, calculating the actual heat transfer gas pressure based on the controlled heat transfer gas pressure and (ii) calculating the second temperature of the substrate based on the actual heat transfer gas pressure and the first temperature of the substrate support. Calculating the second temperature of the substrate includes (i) receiving the heat transfer gas pressure from a pressure sensor arranged within the substrate support and (ii) calculating the second temperature of the substrate based on the heat transfer gas pressure received from the pressure sensor.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Some substrate processing systems operate (e.g., perform plasma etching on a substrate) using relatively high power (e.g., greater than or equal to 60 kW). A substrate support, such as an electrostatic chuck (ESC), may be controlled (e.g., cooled) to maintain a desired substrate temperature in the presence of high power plasma in the processing chamber. In some examples, the substrate support may dissipate as much as 30 kW of heat.

Non-uniform heat dissipation may cause process and substrate non-uniformities. For example, the substrate temperature may increase approximately 45° C. (e.g. +/−1° C.) in the presence of 6 kW plasma. Other non-uniformities (e.g., non-uniformities in a thermal stack of the substrate support, ion flux to a surface of the substrate, etc.) may cause temperatures across the substrate to vary undesirably.

In some examples, temperature variation across the substrate support and the substrate may be reduced by optimizing cooling channel patterns of the substrate support, optimizing characteristics (e.g., thickness) of a thermal bond layer provided between a baseplate and a ceramic layer of the substrate support, etc. However, available cooling channel patterns are limited by geometrical and other structural constraints of the baseplate, such as electrical connections, heat transfer gas channels, etc. Conversely, optimizing a thickness of the thermal bond layer (e.g., ensuring uniform thickness of the thermal bond layer across the substrate support) may not compensate for local temperature non-uniformities in the substrate support.

Substrate temperature systems and methods according to the principles of the present disclosure reduce temperature variation across a substrate during processing. Temperatures across the substrate are estimated in accordance with control and process variables. In one example, correlations between variables and substrate temperatures may be determined using various sensor measurements and an actual measurement of the temperature of a temperature sensing test substrate (e.g., in situ, during manufacture, calibration, servicing, etc.). Substrate temperatures may be mapped to sensor measurements indicating variables including, but not limited to, substrate temperatures (e.g., wafer temperature), substrate support (e.g., ceramic layer) temperatures and heat transfer gas flow modeling (e.g., heat transfer gas flow and heat transfer gas pressure). Temperature control parameters (e.g., the heat transfer gas flow and pressure) may then be adjusted to maintain constant temperatures across the substrate. Mapping may be performed for each processing chamber, substrate support, process, etc. Accordingly, the substrate temperature control systems and methods may be configured to compensate for temperature variations across substrates being processed in specific processing chambers.

Figure 1:
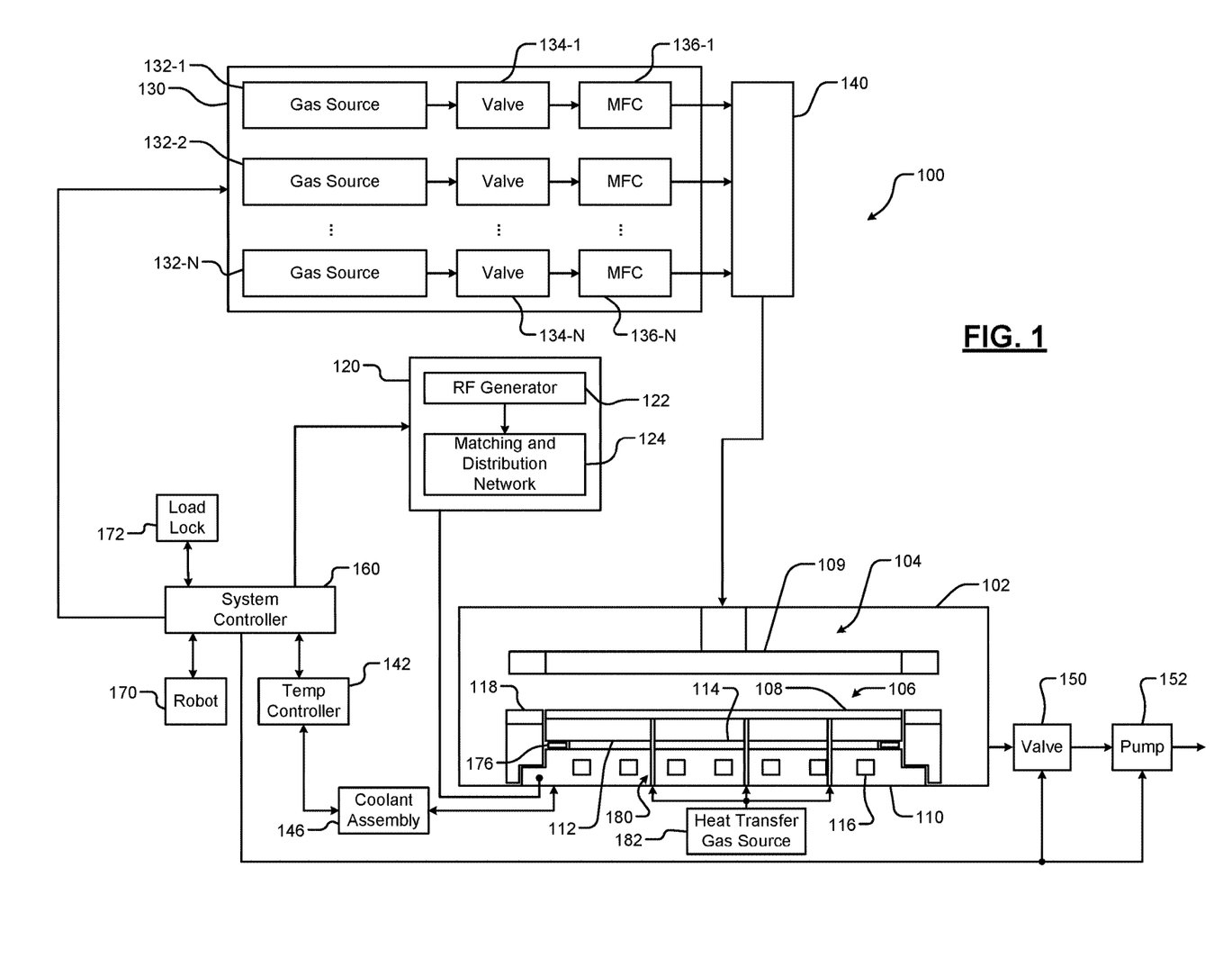
FIG. 1 is an example substrate processing system according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an ESC. During operation, a substrate 108 is arranged on the substrate support 106. While a specific substrate processing system 100 and processing chamber 102 are shown as an example, the principles of the present disclosure may be applied to other types of substrate processing systems and processing chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a baseplate 110. In some examples, the baseplate 10 may be conductive and act as a lower electrode. In other examples, the baseplate 110 may be non-conductive and include an embedded electrode. The baseplate 110 supports a ceramic layer 112. A bond layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be, for example, DC grounded, AC grounded, floating, etc. In the present example, the RF voltage is supplied to the lower electrode. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more etch gases and mixtures thereof. The gas sources may also supply carrier and/or purge gas. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes a plurality of channels 180 arranged to provide a heat transfer gas such as helium from a heat transfer gas source 182 to a backside of the substrate 108. The heat transfer gas facilitates cooling of the substrate 108 and/or the ceramic layer 112. Although shown separately, the heat transfer gas source 182 may be implemented within the gas delivery system 130. Further, although the substrate support 106 is shown to include three of the channels 180 for simplicity, the substrate support 106 may include any number of the channels 180.

The temperature controller 142 (and/or the system controller 160) according to the principles of the present disclosure implements a substrate temperature calculation system and method as described below in more detail. For example, the temperature controller 142 is configured to calculate and control a temperature of the substrate 108 based on a temperature of the substrate support 106 (e.g., the ceramic layer 112) heat transfer gas flow, and heat transfer gas pressure. In one example, the temperature controller 142 is configured to calculate the temperature of the substrate 108 based on the temperature of the substrate support 106, a controlled (e.g., input) heat transfer gas pressure and/or flow rate, and an actual (i.e., as provided to the substrate support 106) heat transfer gas pressure and/or flow rate.

Figure 2A:
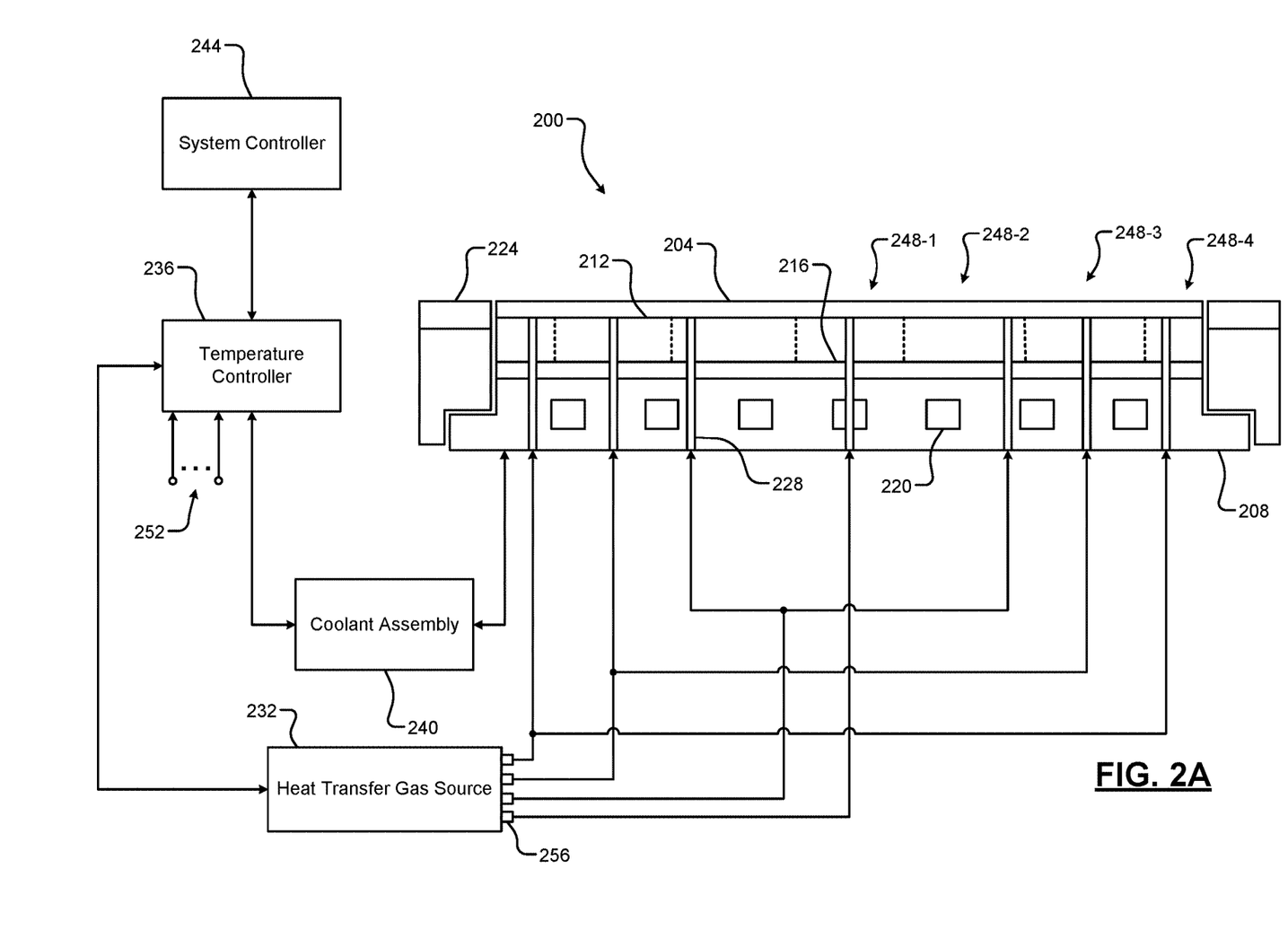
FIG. 2A is an example substrate according to the principles of the present disclosure.
Figure 2B:
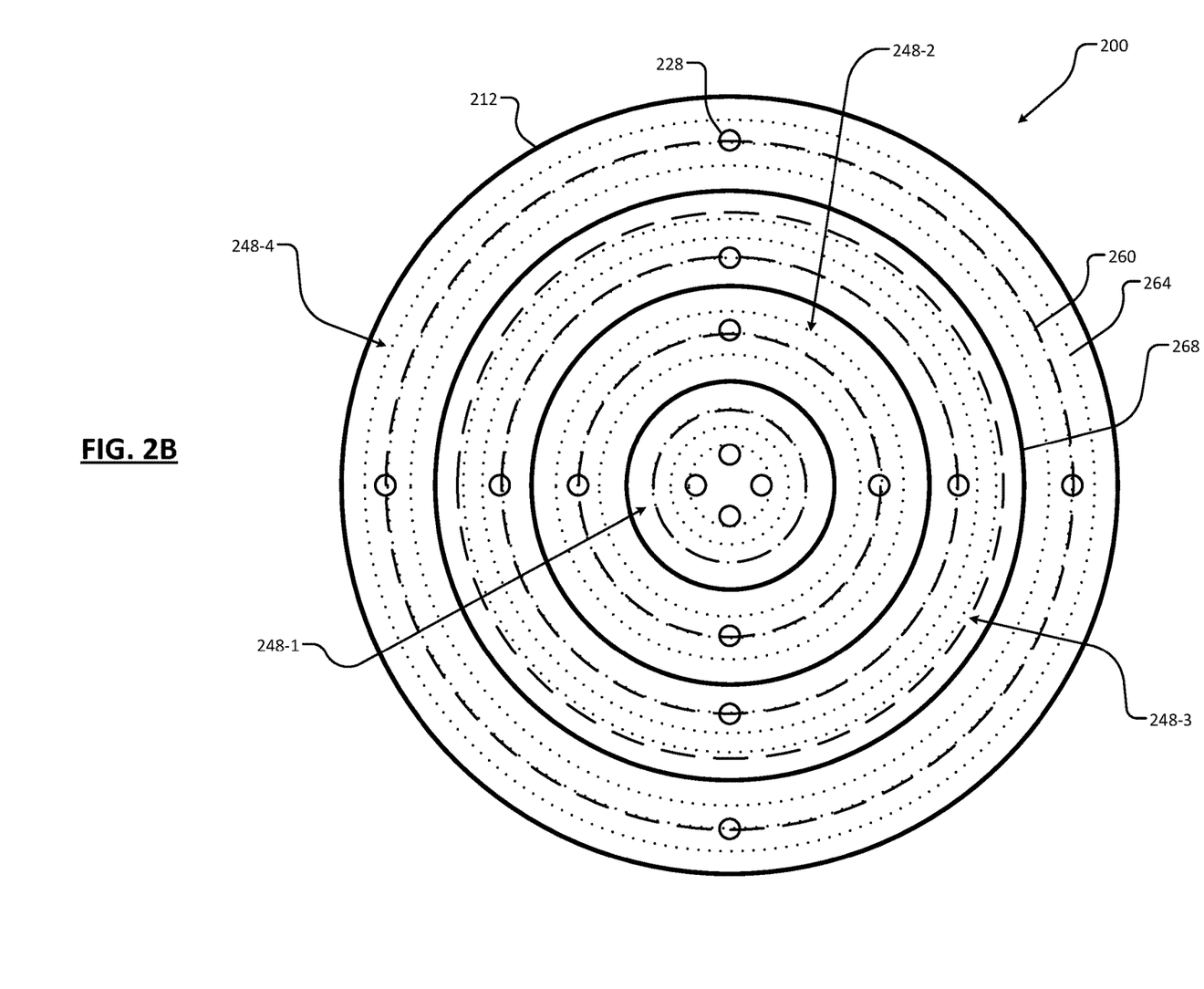
FIG. 2B is a plan view of an example substrate support according to the principles of the present disclosure.

Referring now to FIGS. 2A and 2B, an example substrate support 200 configured to support a substrate 204 is shown. The substrate support 200 includes a conductive baseplate 208, a ceramic layer 212, and, in some examples, a bond layer 216 arranged between the ceramic layer 212 and the baseplate 208. The baseplate 208 may include one or more coolant channels 220 for flowing coolant through the baseplate 208. The substrate support 200 may include an edge ring 224 arranged to surround an outer perimeter of the substrate 204. The substrate support 200 includes a plurality of channels 228 arranged to provide a heat transfer gas such as helium from a heat transfer gas source 232 to a backside (i.e., underside) of the substrate 204. The heat transfer gas facilitates cooling of the substrate 204 and/or the ceramic layer 212.

A temperature controller 236 communicates with a coolant assembly 240 to control coolant flow through the channels 220. The temperature controller 236 communicates with the heat transfer gas source 232 to control flow of the heat transfer gas (e.g., via valves of a gas delivery system such as the gas delivery system 130 described above in FIG. 1). The temperature controller 236 may also operate the coolant assembly 240 to selectively flow the coolant through the channels 220 to cool the substrate support 200. The temperature controller 236 may be a separate controller, implemented within a system controller 244, etc.

The temperature controller 236 is configured to measure and/or calculate a temperature of the substrate 204 based in part on temperatures of the substrate support 200 as described below in more detail. In one example, the temperature controller 236 determines the temperature of the substrate 204 in accordance with temperatures of the substrate support 200 as measured using one or more temperature sensors arranged throughout different radial zones of the substrate support 200. For example, the ceramic layer 212 may include an inner zone 248-1, a mid-inner zone 248-2, a mid-outer zone 248-3, and an outer zone 248-4, referred to collectively as the zones 248. Although shown with the four concentric zones 248, in embodiments the substrate support 200 may include one, two, three, or more than four of the zones 248. The shapes of the zones 248 may vary. For example, the zones 248 may be provided as quadrants or in another grid-like arrangement. The temperature controller 236 determines the temperature of the substrate support 200 (e.g., temperatures of each of the zones 248 of the ceramic layer 212) in accordance with signals received from the one or more sensors (e.g., shown as sensor inputs 252). In other words, in this example, the temperature controller 236 is configured to directly measure the temperature of the substrate support 200.

In other examples, the temperature controller 236 may be configured to calculate the temperature of the substrate support 200 using other measured and/or estimated values, such as a model (e.g., a model of coolant flows of the substrate support). For example, the temperature controller 236 may be configured to calculate the temperature of the substrate support 200 based on one or more of a temperature of the coolant supplied to the substrate support 200 from the coolant assembly 240, a temperature of the coolant returning from (i.e., flowing out of) the substrate support 200 back to the coolant assembly 240, an RF power supplied to the substrate support 200, etc. as described in more detail in U.S. patent application Ser. No. 15/824,447, filed on Nov. 28, 2017, the entire contents of which are incorporated herein.

The temperature controller 236 may receive the flow of the heat transfer gas from one or more sensors (e.g., helium sensors) 256 arranged between the heat transfer gas source 232 and the substrate support 200. For example, the sensors 256 may correspond to sensors measuring heat transfer gas flow (and/or pressure) provided to the different zones 248 of the substrate support 200. The temperature of the substrate 204 may correspond to a heat transfer gas pressure below the substrate 204, and the heat transfer gas pressure is dependent upon the heat transfer gas flow rates. In some examples, the temperature of the substrate support 200 may be adjusted to adjust the temperature of the substrate 204. However, adjusting the temperature of the substrate support 200 adjusts the temperature of the entire substrate 204 and does not allow independent adjustment of different portions of the substrate 204. Accordingly, a user may attempt to further adjust temperatures of the substrate 204 by adjusting the heat transfer gas flow rates in individual ones of the zones 248 to adjust respective heat transfer gas pressures in the zones 248.

Typically, the temperature of the substrate 204 is correlated to the temperature of the substrate support 200, which in turn may be correlated to the heat transfer gas pressure and the corresponding heat transfer gas flow rate provided by the heat transfer gas source 232. For example, the temperature of the substrate 204 may correspond to $Q=h/\Delta T$, where Q is a heat flux associated with the substrate 204 in the presence of a plasma heat load, h is a heat transfer coefficient of the heat transfer gas, and $\Delta T$ corresponds to a difference (e.g., $T_{substrate}-T_{support}$) between a temperature of the substrate 204 ($T_{substrate}$) and a temperature of the substrate support 200 ($T_{support}$). Accordingly, the temperature of the substrate 204 varies in accordance with the temperature of the substrate support 204 and the heat transfer coefficient h. Since heat transfer coefficient h is a function of heat transfer gas pressure, the user may adjust the heat transfer gas flow to adjust a temperature of the substrate 204. However, the measured heat transfer gas flow received from the sensors 256 may not be an accurate indication of the actual temperature of the substrate 204 as described below in more detail.

For example, the heat transfer coefficient h is a function of the heat transfer gas pressure and other system variables. In one example, the heat transfer gas coefficient h for a given one of the zones 248 may be defined according to $h=k/(d+g_1+g_2)$, where k is a thermal conductivity of the heat transfer gas, d is a distance (e.g., a heat transfer gap) between the substrate 204 and the substrate support 200, and $g_1+g_2$ are thermal transfer efficiencies of interfaces between the zone 248 and adjacent ones of the zones 248 (or, in some examples, between the zone 248 and the processing chamber). The thermal conductivity k may be a function of the heat transfer gas pressure P such that k=f(P).

In one example as shown in FIG. 2B, the heat transfer gas is provided to a backside of the substrate 204 (i.e., in a heat transfer gap between the ceramic layer 212 and the substrate 204) via the channels 228, and the heat transfer gas is distributed throughout the zones 248 via grooves 260. The grooves 260 distribute the heat transfer gas pressure within each of the zones 248. The ceramic layer 212 may further include a plurality of raised projections (e.g., cylindrical projections, which may be referred to as "mesas," represented by dots in FIG. 2B) 264 distributed throughout the zones 248. The projections 264 maintain the heat transfer gap between the ceramic layer 212 and the substrate 204. The heat transfer gas is provided into this gap at selected pressures in the respective zones 248 to conduct (i.e., transfer) heat from the substrate 204 and into the ceramic layer 212.

In some examples, the ceramic layer 212 may include seal bands 268 arranged between adjacent ones of the zones 248. The seal bands 268 contact a lower surface of the substrate 204 to form a seal and restrict transmission of the heat transfer gas between the zones 248. Accordingly, the seal bands 268 may facilitate maintaining each of the zones 248 at a different pressure and, therefore, at a different temperature. For example, a first pressure may be maintained in one of the zones 248 (e.g., the zone 248-1) that is greater than a second pressure that is maintained in an adjacent one of zones 248 (e.g., the zone 248-2). The seal bands 268 prevent heat transfer gas from leaking from the zone 248-1 having the first, greater pressure into the zone 248-2 having the second, lesser pressure. In other examples, the ceramic layer 212 may not include the seal bands 268.

Variations in the substrate 204 (e.g., bowing, lower surface non-uniformities, stress during processing, etc.), the ceramic layer 212 (e.g., warping, non-uniformities in heights of the projections 264 and/or the seal bands 268, etc.), and the seal bands 268 (e.g., due to erosion over time) may interfere with control of the pressures within the respective zones 248. For example, variations in the substrate 204 (e.g., variations in thickness, warping, etc.) may be correlated to variations in flow between the zones 248 and thermal variability. Accordingly, one or more variabilities may cause leakage of heat transfer gas between the zones 248 and/or from the zones 248 (e.g., the outer zone 248-4 and/or others of the zones 248) into the processing chamber, which in turn may cause process and substrate non-uniformities due to inaccurate control of substrate temperatures. For example, a controlled and/or measured flow and/or pressure (e.g., as input by a user and measured via the sensors 256) may differ from actual pressures within the zones 248.

Figure 2C:
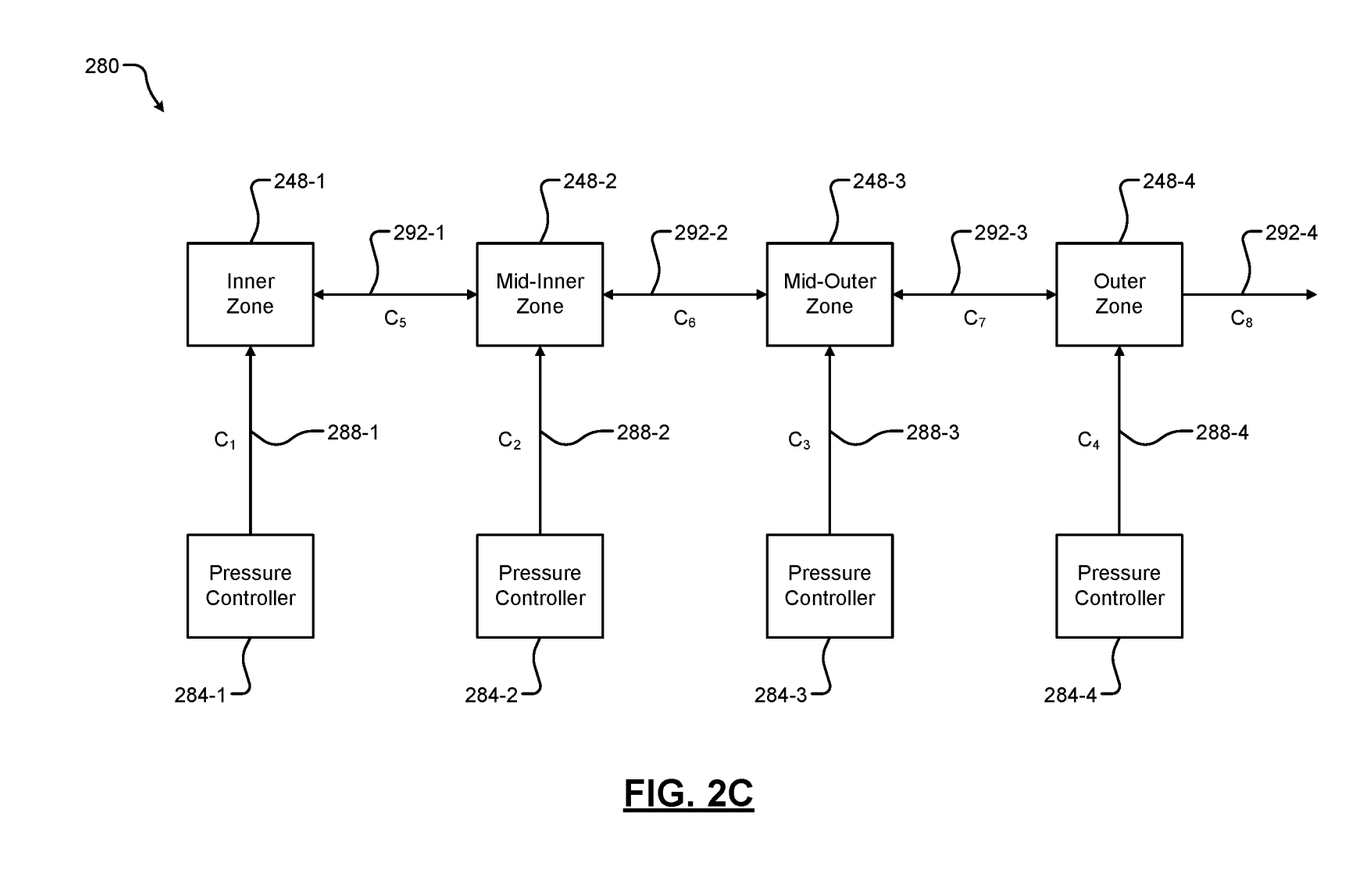
FIG. 2C is an example model of heat transfer gas flow in a substrate support according to the principles of the present disclosure.

FIG. 2C shows an example heat transfer gas flow model 280 characterizing the flow of heat transfer gas in the substrate support 200. For example, heat transfer gas is provided from the heat transfer gas source 232 to each of the zones 248 in accordance with the control of a respective pressure controller (e.g., pressure controllers 284-1, 284-2, 284-3, and 284-4, referred to collectively as the pressure controllers 284). Heat transfer gas flows to the zones 248 via a respective flow path 288-1, 288-2, 288-3, and 288-4, referred to collectively as flow paths 288. Each of the flow paths 288-1, 288-2, 288-3, and 288-4 may have a respective fluid conductance $C_1$, $C_2$, $C_3$, and $C_4$. Further, heat transfer gas may flow between adjacent ones of the zones 248 due to the variabilities in the substrate 204 and/or the substrate support 200 as described above via leak paths 292-1, 292-2, and 292-3, and/or from the outer zone 248-4 to the processing chamber via leak path 292-4 (referred to collectively as leak paths 292). Each of the flow paths 292-1, 292-2, and 292-3, and 292-4 may have a respective fluid conductance $C_5$, $C_6$, $C_7$, and $C_8$.

Typically, temperature of the substrate support 204 is adjusted by controlling the pressure of the heat transfer gas provided to the substrate support 200 using the pressure controllers 284. However, pressures within the zones 248 differ from the respective controlled pressures due to factors including, but not limited to, loss of pressure within the flow paths 288 (e.g., in accordance with conductance of the flow paths 288) between the zones 248 via the leak paths 292-1, 292-2, and 292-3, and into the processing chamber via the leak path 292-4. Accordingly, attempting to determine and adjust the temperature of the substrate 204 in accordance with the controlled pressures and respective desired temperatures may be difficult. For example, a relationship between the controlled pressures and desired temperature may vary between processing chambers, from substrate to substrate, may vary over time for a given processing chamber, etc.

The temperature controller 236 (and/or the system controller 244) according to the principles of the present disclosure is configured to calculate and control the temperature of the substrate 204 to compensate for differences between the controlled pressures and the actual pressures. For example only, the temperature controller may be configured to calculate and control the temperature of the substrate 204 based on the temperature of the substrate support 200, the controlled heat transfer gas pressure, and the actual (i.e., within the zones 248 of the substrate support 200) heat transfer gas pressure. As described below in more detail, in some examples the actual heat transfer gas pressure may be calculated (e.g., according to a model, calibration data, etc.), while in other examples, the actual heat transfer gas pressure may be directly measured (e.g., using one or more sensors arranged in the substrate support 200). In other examples, the actual heat transfer gas pressure may be not be calculated or directly measured to calculate and control the temperature. Rather, the temperature may be determined and calculated based on a modeled, measured correlation, or other predetermined relationship between temperature and other variables (e.g., fluid conductances of flow paths within the substrate support 200) as described below in more detail.

For example, the temperature controller 236 implements a temperature control model that correlates input heat transfer gas pressures with actual pressures within the zones 248, the temperature of the substrate support 200, and respective temperatures of the substrate 204 (e.g., in accordance with the heat transfer gas flow model 280. In other words, the temperature controller 236 is configured to determine the temperature of the substrate 204 based in part on a difference between the input (controlled) pressures and the actual pressures. For example, setpoints of a process recipe implemented by the temperature controller 236 may correspond to desired process temperature setpoints rather than desired control inputs (i.e., controlled heat transfer gas pressures).

The temperature control model may be generated in accordance with a calibration process that is performed for the substrate support 200 (i.e., the calibration process may be separately performed for a given substrate support in situ, during manufacture, servicing, etc.) to determine a relationship between the heat transfer gas pressure P in a given zone 248 and the temperature of a corresponding portion of the substrate 204 arranged on the substrate support 200. In other words, the temperature of the substrate 204 may be determined as a function of the heat transfer gas pressure P (e.g., for a fixed, predetermined heat flux Q) and a temperature of the substrate support 200. Accordingly, when the heat transfer gas pressure P is known during operation of the substrate support 200 (e.g., via modeling or sensor measurements as described below in more detail), the heat transfer gas P may be adjusted to adjust the temperature of the substrate 204.

In one example calibration process for correlating the heat transfer gas pressure P to temperatures of the substrate 204, relationships between the controlled pressures, the actual pressures (i.e., actual pressures of the heat transfer gas in the zones 248), the temperature of the substrate support 200, and the temperatures of the substrate 204 may be determined using various sensor measurements and an actual measurement of the temperature of a temperature sensing test substrate. In other examples, the temperature of the substrate support 200 may be determined and calculated based on a predetermined relationship between temperature and fluid conductances of flow paths within the substrate support. The test substrate may include a plurality of temperature sensors arranged to correspond to locations throughout the zones 248. In some examples, the test substrate may be configured for measuring varying etch rates throughout the zones 248. In some examples, during the calibration process, pressure sensors may be distributed throughout the substrate support (e.g., in the gap between the substrate 204 and the ceramic layer 212, etc.) to measure the heat transfer pressure P in various locations. In this manner, the temperatures of the substrate 204 may be determined for corresponding heat transfer gas pressures P.

During operation of the substrate support 200, temperatures of the substrate 204 may then be determine and controlled in accordance with the heat transfer gas pressure P. In examples where the substrate support 200 does not include heat transfer gas pressure sensors arranged in the substrate support 200 (as described below in other examples), heat transfer gas flows and pressures for a given substrate support (e.g., in the flow paths 288, the leak paths 292, etc.) may be determined and characterized for respective input pressures as a heat transfer gas pressure model. In this manner, actual heat transfer gas pressures within the zones 248 may be determined for the controlled pressures (e.g., for an entire range of possible input pressures of the pressure controllers 284).

In other words, because differences in pressure between the controlled pressures (e.g., as indicated by sensors 256) and the actual pressures within the zones 248 are determined in accordance with the characterization of the heat transfer gas flow model 280, the temperature controller 236 is configured to determine the actual pressures within the zones 248 for respective controlled pressures. With the calculated actual pressures (e.g., as correlated to the controlled pressures using the model) and the temperature of the substrate support 200 being known (and/or calculated as described above), the temperature controller 236 is configured to calculate the temperature of the substrate 204 using the controlled pressures, the calculated/modeled actual heat transfer gas pressures, and the temperature of the substrate support 200.

As one example, an unknown pressure $P_2$ (e.g., corresponding to a heat transfer gas pressure P in a predetermined location in a system) may be defined according to flow paths between the location and one or more other adjacent volumes (e.g., first and second "pressure baths" having pressures $P_1$ and $P_3$). The pressure baths may represent infinitely large volumes. Accordingly, the pressures $P_1$ and $P_3$ may be constant (e.g., changes in $P_1$ and $P_3$ may be 0). A change in the pressure $P_2$ may be defined according to:

$$\frac{dP_2}{dt} = (P_1 - P_2)c_1 + (P_3 - P_2)c_2,$$

where $c_1$ corresponds to a fluid conductance between the location for $P_2$ and the first pressure bath and $c_2$ corresponds to a fluid conductance between the location for $P_2$ and the second pressure bath.

In the substrate support 200, each of the pressure controllers 284 and the processing chamber may be represented as pressure baths having a constant pressure as described above. Accordingly, changes in the heat transfer gas pressures $P_{IZ}$, $P_{MIZ}$, $P_{MOZ}$, and $P_{OZ}$ (corresponding to the inner zone 248-1, 248-2, 248-3, and 248-4, respectively) may be defined according to:

$$\frac{dP_{IZ}}{dt} = (P_{UPC1} - P_{IZ})C_1 + (P_{MIZ} - P_{IZ})C_5,$$

$$\frac{dP_{MIZ}}{dt} = (P_{UPC2} - P_{MIZ})C_2 + (P_{IZ} - P_{MIZ})C_5 + (P_{MOZ} - P_{MIZ})C_6,$$

$$\frac{dP_{MOZ}}{dt} = (P_{UPC3} - P_{MOZ})C_3 + (P_{MIZ} - P_{MOZ})C_6 + (P_{OZ} - P_{MOZ})C_7, \text{ and}$$

$$\frac{dP_{OZ}}{dt} = (P_{UPC4} - P_{OZ})C_4 + (P_{MOZ} - P_{OZ})C_7 + (P_{chmb} - P_{OZ})C_8.$$

where $P_{UPC1}$, $P_{UPC2}$, $P_{UPC3}$, and $P_{UPC4}$ correspond to pressures (e.g., controlled pressures) of the pressure controllers 284-1, 284-2, 284-3, and 284-4, respectively, $P_{chmb}$ corresponds to a pressure within the processing chamber containing the substrate support 200, and $C_1$-$C_8$ correspond to the fluid conductance of the paths 288 and 292 as shown in FIG. 2C.

During one example calibration process, the values of $C_1$-$C_8$ may be determined to model the heat transfer gas pressures P in accordance with other known (e.g., measured or controlled) pressures in the above equations, such as the pressures of the pressure controllers 284 and the pressure within the processing chamber. For example, conductance $C_1$-$C_4$ may be measured using flow sensors in the respective flow paths while controlling pressures of the pressure controllers 284 without the substrate 204 arranged on the substrate support 200. Conversely, conductance $C_5$-$C_8$ may be measured with the substrate 204 clamped to the substrate support 200 and the pressures of the pressure controllers 284 set according to various conditions. For example, conductance $C_8$ may be measured with pressures of each of the pressure controllers 284 set to a same value (e.g., $P_{UPC1}=P_{UPC2}=P_{UPC3}=P_{UPC4}$). Conductance $C_5$ and $C_7$ may be measured with pressures of the pressure controllers 284-1 and 284-4 set to a same first value while pressures of the pressure controllers 284-2 and 284-3 are set to a same second value (e.g., $P_{UPC1}=P_{UPC4}\neq P_{UPC2}=P_{UPC3}$). Conductance $C_6$ may be measured with pressures of the pressure controllers 284-1 and 284-2 set to a same first value while pressures of the pressure controllers 284-3 and 284-4 are set to a same second value (e.g., $P_{UPC1}=P_{UPC2}$; $P_{UPC3}=P_{UPC4}$).

With the heat transfer gas pressures P modeled in accordance with the calibration process as described above, the heat transfer gas pressures P may be determined during operation of the substrate support. In one example, a lookup table may be used (e.g., by the controller 236) to correlate controlled pressures for each of the zones 248 to the heat transfer gas pressures P in accordance with the heat transfer gas pressure model. The temperatures of the substrate 204 may then be controlled in accordance with the heat transfer gas pressures and the temperature of the substrate support 200.

Figure 3A:
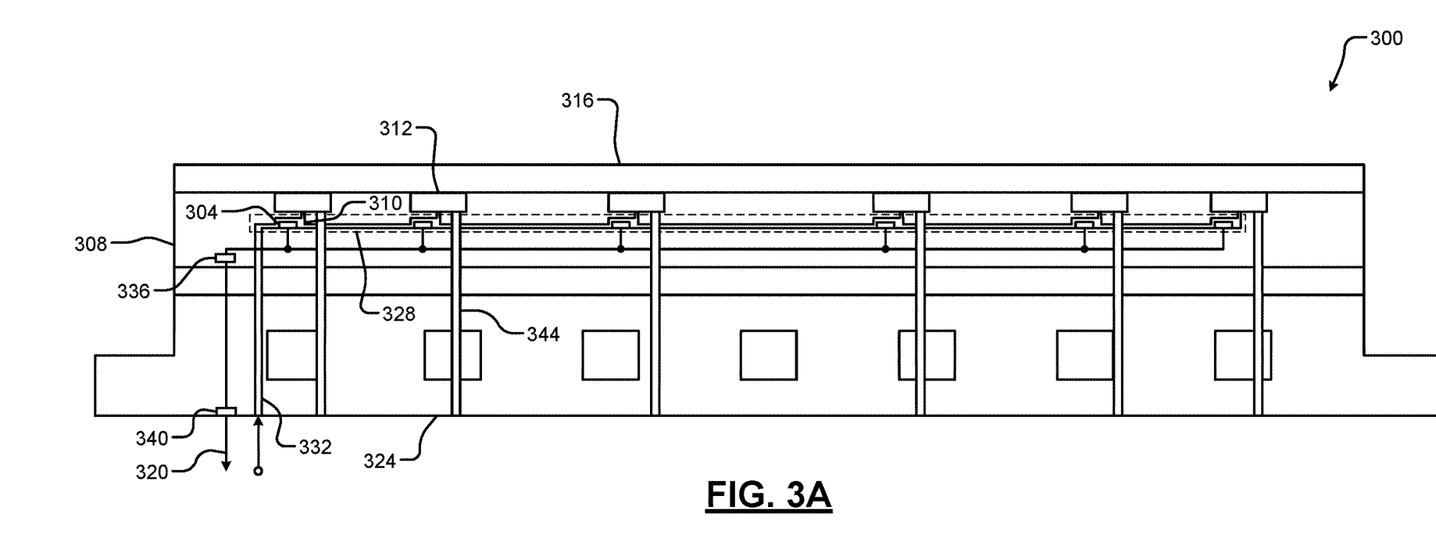
FIGS. 3A, 3B, and 3C are example arrangements of heat transfer gas pressure sensors provided in a substrate support according to the principles of the present disclosure.
Figure 3B:
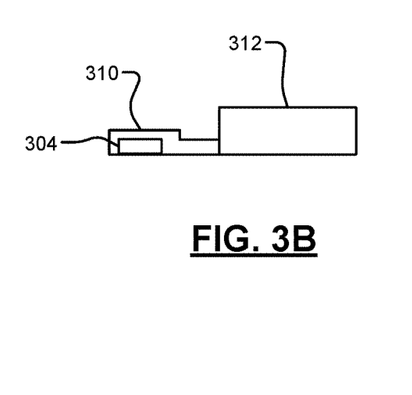
Figure 3C:
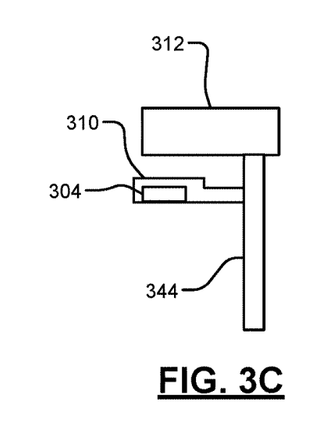

Referring now to FIGS. 3A, 3B, and 3C, another example substrate support 300 is shown. In this example, the substrate support 300 includes one or more pressure sensors (i.e., heat transfer gas pressure sensors) 304 embedded within a ceramic layer 308. The pressure sensors 304 are arranged in respective cavities 310 in fluid communication with heat transfer gap(s) 312 between the ceramic layer 308 and a backside of a substrate 316. Accordingly, the pressure sensors 304 are arranged to directly measure heat transfer gas pressures P in the heat transfer gaps 312 and generate signals 320 indicating the heat transfer gas pressures P (e.g., to temperature controller 236, system controller 244, etc.).

In one example, the pressure sensors 304 are microelectromechanical system (MEMS) sensors. For example, the pressure sensors 304 may be planar MEMS sensors having a thickness of 0.8 to 1.2 mm. In some examples, an RF grid or other structure may be provided to electrically isolate the pressure sensors 304 from a baseplate 324 and reduce arcing and exposure to RF power and DC voltages to prevent electrical breakdown of the pressure sensors 304. For example, a Faraday cage 328 embedded within the ceramic layer 308 may be arranged to surround the pressure sensors 304. Additionally or alternatively to the Faraday cage 328, the pressure sensors 304 may include an electrically insulating coating such as, but not limited to, alumina, yttria, and silica.

In some examples, a purge channel 332 in fluid communication with the cavities 310 may be used to provide inert gas to the cavities 310 during operation steps or modes where heat transfer gas is not provided to the heat transfer gaps 312. For example, during cleaning processes when the substrate 316 is not present, the ceramic layer 308 may be exposed to reactive species that may damage (e.g., via etching) the pressure sensors 304. Accordingly, providing inert gas to the cavities 310 chemically isolate the pressure sensors 304 from the reactive species. For example, the purge channel 332 may be in fluid communication with the gas delivery system 130, the valve 150 and the pump 152, etc.

The signals 320 indicating the heat transfer gas pressures P may correspond to digital output signals of the pressure sensors 304. In one example, outputs of the pressure sensors 304 are connected to one or more electrical bus layers (e.g., embedded within or arranged below the ceramic layer 308, not shown in FIG. 3). In other examples, output signals of the pressure sensors 304 are analog output signals and analog-to-digital (A/D) circuitry (represented schematically at 336) embedded within the ceramic layer 308 converts the analog output signals to digital signals (i.e., the signals 320). In still another example, output signals of the pressure sensors 304 are analog output signals and A/D circuitry 340 arranged within or below (e.g., external to) the baseplate 324 converts the analog output signals to digital signals.

Although shown below and in fluid communication with the heat transfer gaps 312 in FIG. 3A, other configurations of the pressure sensors 304 and the cavities 310 may be implemented as shown in FIGS. 3B and 3C. For example, as shown in FIG. 3B, the cavities 310 may be arranged laterally adjacent to (and co-planar with) the heat transfer gaps 312. Conversely, as shown in FIG. 3C, the cavities 310 may be in fluid communication with heat transfer gas channels 344.

Figure 4:
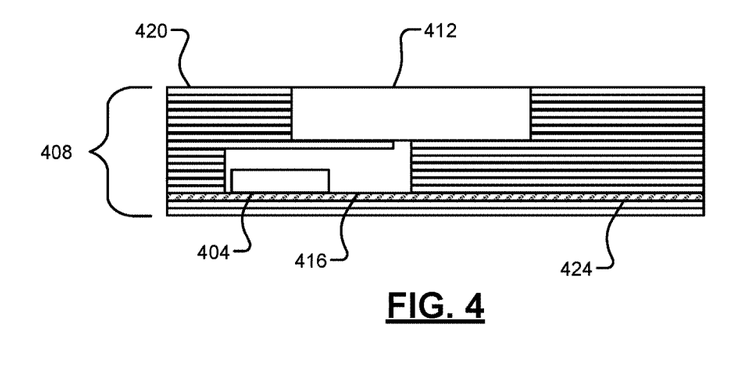
FIG. 4 is an example arrangement of a heat transfer gas pressure sensor shown in more detail according to the principles of the present disclosure.

Referring now to FIG. 4, a portion of an example substrate support 400 including a pressure sensor 404 is shown in more detail. For example, a ceramic layer 408 including heat transfer gap 412 and a cavity 416 comprising the pressure sensor 404 may comprise a plurality of laminated layers 420. An electrical bus layer 424 may be embedded within the ceramic layer 408. A plurality of the pressure sensors 404 may be connected to the electrical bus layer 424, which outputs corresponding pressure sensor signals (e.g., the signals 320 as shown in FIG. 3A) from the substrate support 400.

Figure 5A:
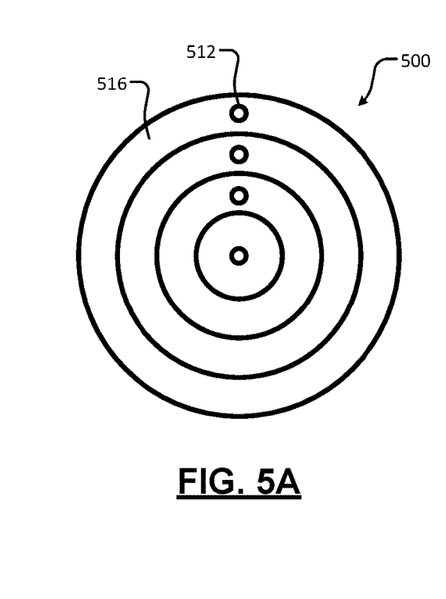
FIGS. 5A, 5B, and 5C are plan views of example substrate supports including pressure sensors according to the principles of the present disclosure.
Figure 5B:
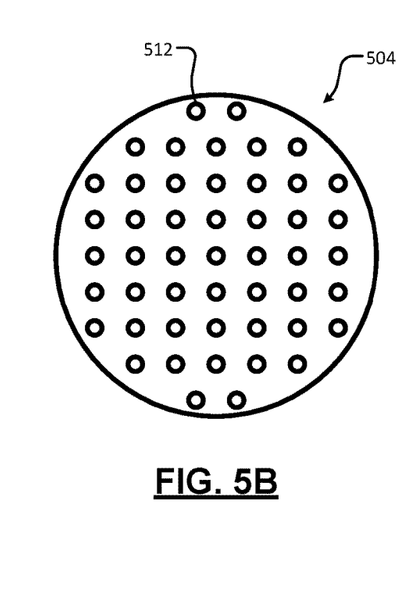
Figure 5C:
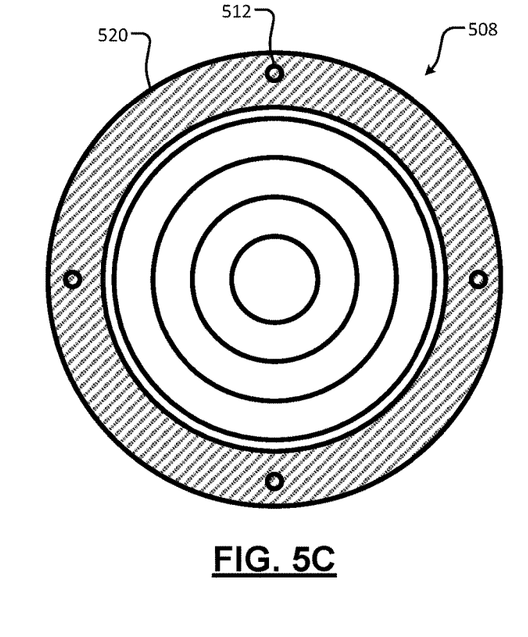

Referring now to FIGS. 5A, 5B, and 5C, plan views of example substrate supports 500, 504, and 508 including pressure sensors 512 are shown. As shown in FIG. 5A, one of the pressure sensors 512 may be arranged in each of respective radial zones 516. In this arrangement, temperatures of a substrate may be separately controlled in corresponding ones of the radial zones 516. As shown in FIG. 5B, a plurality (e.g., 10 or more) of the pressure sensors 512 may be distributed throughout the substrate support 504 to allow control of temperatures in specific locations of a substrate. As shown in FIG. 5C, one or more of the pressure sensors 512 may be provided in an edge ring 520 to allow control of edge ring temperatures (e.g., in implementations where the temperature of the edge ring 520 is controlled using a heat transfer gas).

Figure 6:
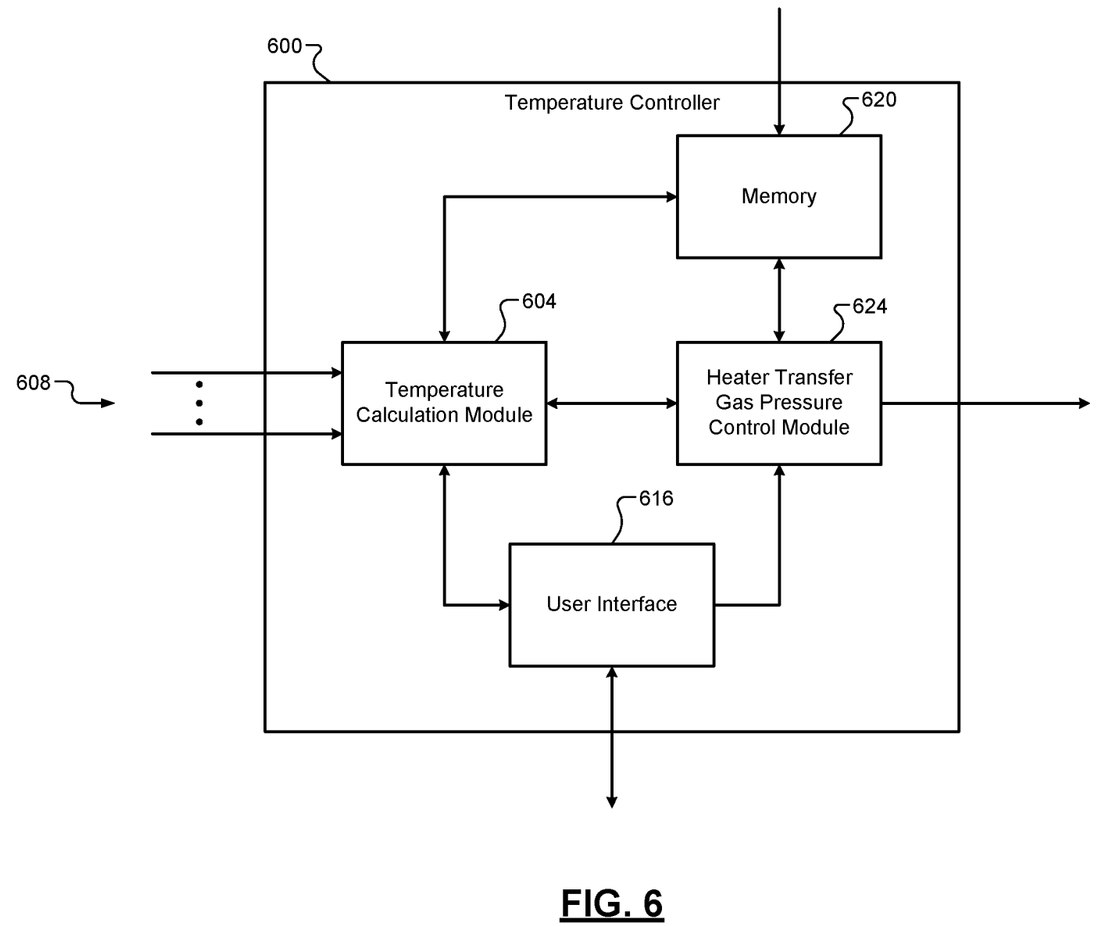
FIG. 6 is an example temperature controller according to the present disclosure.

Referring now to FIG. 6, an example temperature controller 600 is shown. The temperature controller 600 includes a temperature calculation module 604 configured to calculate a temperature of the substrate 204 based on various inputs 608. The inputs 608 may include, but are not limited to, controlled pressures of the pressure controllers 284 (i.e., as input/requested by a user, recipe, etc.), measurements from sensors (e.g., pressure/flow sensors 256, pressure sensors 304, etc.), and a temperature of the substrate support 200 (e.g., measured and/or calculated temperatures of each of the zones 248). As used herein, the calculated temperature may correspond to a single calculated temperature of the substrate 204, a plurality of temperatures of respective zones of the substrate 204 corresponding to the zones 248 of the substrate support 200, etc.

For example, the temperature calculation module 604 may be configured to execute a temperature control model (e.g., a formula or equation, lookup table, etc.) to calculate the temperature of the substrate 204 based on the inputs 608 as described above in FIGS. 2A, 2B, and 2C (e.g., in accordance with heat transfer gas pressures P and Q=h/ΔT). The heat transfer gas pressures P may be calculated (e.g., according to a heat transfer gas pressure model as described above) and/or measured using pressure sensors 304. The temperature calculation module 604 may provide the calculated temperature to a user interface (e.g., to be displayed to a user) 616. For example, the user interface 616 may correspond to a display and/or inputs provided at the temperature controller 600, a system controller (e.g., the system controller 244), or elsewhere on a substrate processing tool.

The temperature controller 600 may include memory 620 configured to store one or more models, formulas, etc., such as the temperature control model described above with respect to FIGS. 2A, 2B, and 2C and, in some examples, the heat transfer gas pressure model. The models may vary based on processing chamber, a process being performed, etc. The temperature calculation module 604 retrieves the temperature control model from the memory 620 to calculate the temperature of the substrate 204 in accordance with the inputs 608 and, in some examples, retrieves the heat transfer gas pressure model to calculate the heat transfer gas pressures P.

The temperature controller 600 may include a heat transfer gas control module 624 configured to adjust the pressure of the heat transfer gas provided to the substrate support 200 based on a desired temperature of the substrate 204. For example, the heat transfer gas control module 624 may receive the calculated temperature from the temperature calculation module 604 and the desired temperature of the substrate 204 (e.g., as input/requested by a user at the user interface 616, provided as a recipe setpoint from the system controller 244, etc.) and adjust the pressure of one or more of the pressure controllers 284 accordingly. In another example, the temperature calculation module 604 may be configured to determine pressure adjustment amounts based on the different between the calculated and desired temperatures of the substrate 204 and provide the adjustment amounts to the heat transfer gas control module 624.

As described above, the temperature control model may correspond to actual temperature measurements of a substrate mapped to known process variables (e.g., the controlled pressures and the temperature of the substrate support 200) in view of modeled variables such as the flows within the paths 288 and 292 and the pressures within the zones 248. Accordingly, the temperature controller 600 is configured to determine (and display, e.g., via the user interface 616) temperatures of the substrate 204 within the respective zones 248 using the temperature control model (and, in some examples, the heat transfer gas pressure model), the temperature of the substrate support, the controlled (input) pressures of the pressure controllers 284, and/or measured heat transfer gas pressures P. Further, rather than adjusting the controlled pressures to achieve a desired temperature, a user may simply input the desired temperature (and/or the desired temperature may be provided as a recipe setpoint) and the temperature controller 600 is configured to adjust the controlled pressures to adjust and maintain the temperature of the substrate 204 in accordance with the temperature control model (e.g., using PID control).

Figure 7:
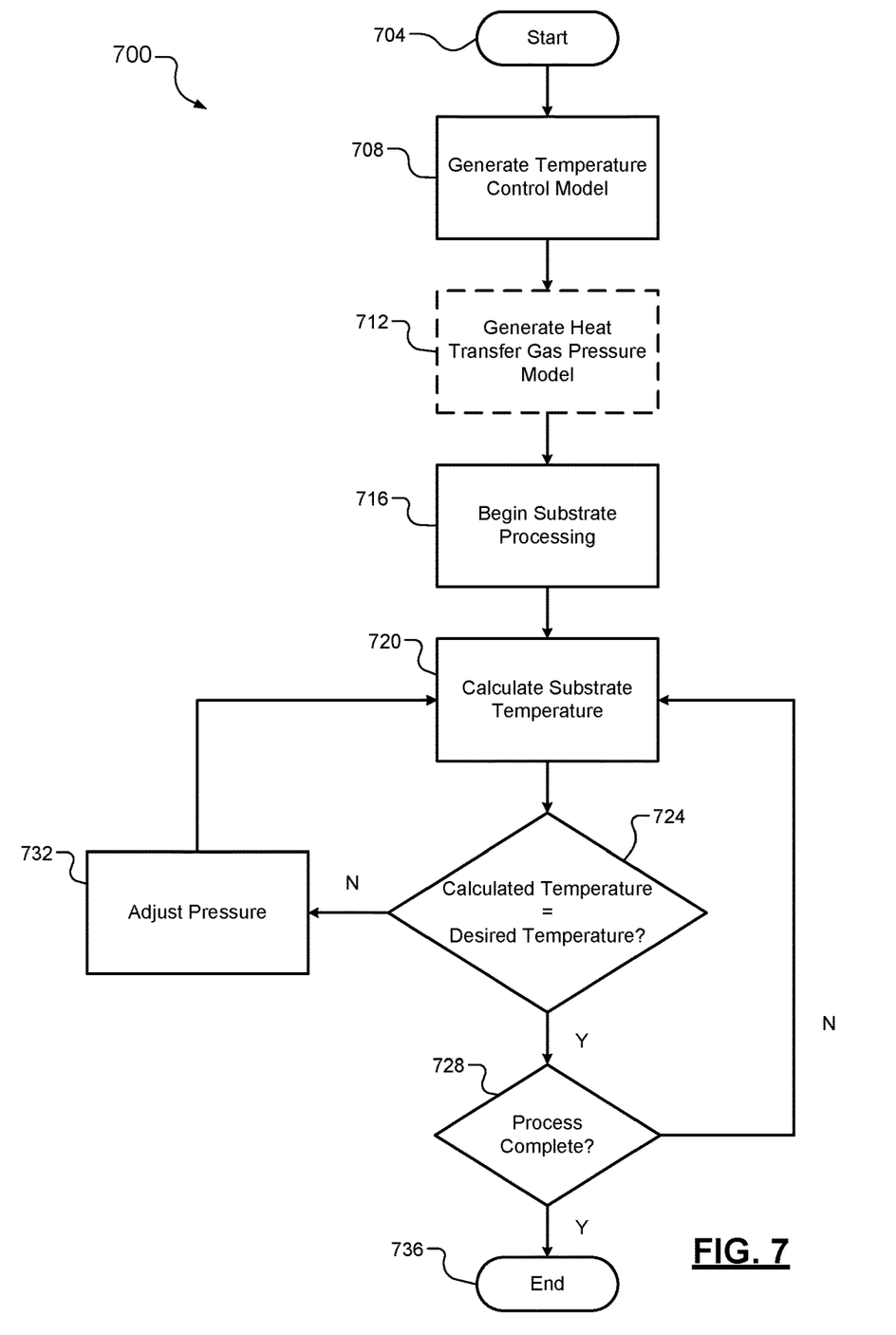
FIG. 7 is an example method for controlling temperature of a substrate according to the principles of the present disclosure.

Referring now to FIG. 7, example method 700 for controlling temperature of a substrate according to the principles of the present disclosure begins at 704. At 708, a temperature control model that determines substrate temperatures as a function of heat transfer gas pressures and substrate support temperature is generated. For example, generating the temperature control model may include measuring temperatures of a temperature sensing test substrate at different heat transfer gas pressures P and substrate support temperatures as described above in FIGS. 2A, 2B, and 2C to characterize temperatures of the substrate according to the heat transfer gas pressures P. At 712, a heat transfer gas pressure model may optionally be generated (e.g., in implementations that do not include pressure sensors). Generating the heat transfer gas pressure model may include determining heat transfer gas flows within the substrate support and characterizing the heat transfer gas pressures P accordingly as described above in FIGS. 2A, 2B, and 2C.

At 716, the method 700 begins processing a substrate. For example, the substrate is arranged on a substrate support and the method 700 (e.g., the system controller 244) begins one or more process steps while controlling a plurality of variables including, but not limited to, heat transfer gas pressure, coolant flow, process gas flow, etc. At 720, the method 700 (e.g., the temperature controller 600) calculates the temperature of one or more zones of the substrate. For example, the temperature controller 600 calculates the temperature of the substrate based on the measured or calculated heat transfer gas pressure, the temperature of the substrate support, and the temperature control model.

At 724, the method 700 (e.g., the temperature controller 600) determines whether the calculated temperature of the substrate corresponds to a desired temperature (e.g., as input by a user, a recipe setpoint, etc.). If true, the method 700 continues to 728. If false, the method 700 continues to 732. At 732, the method 700 (e.g., the temperature controller 600) adjusts the heat transfer gas pressure (e.g., adjusts one or more of the pressure controllers 284 according to the calculated temperatures in the corresponding zones 248). At 728, the method 800 determines whether processing of the substrate is complete. If true, the method 800 ends at 736. If false, the method 700 continues to 720.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A temperature controller for substrate processing system, the temperature controller comprising:
   memory that stores a temperature control model that correlates a heat transfer gas pressure and a first temperature of a substrate support to a second temperature of a substrate arranged on the substrate support, and stores a heat transfer gas pressure model which correlates an input pressure to the heat transfer gas pressure based on heat transfer gas flows within the substrate support;
   a temperature calculation module configured to calculate the heat transfer gas pressure using the heat transfer gas pressure model, and calculate the second temperature of the substrate using the heat transfer gas pressure, the first temperature of the substrate support, and the temperature control model; and
   a heat transfer gas control module configured to adjust the heat transfer gas pressure based on the second temperature of the substrate calculated by the temperature calculation module and a desired third temperature of the substrate.

2. The temperature controller of claim 1, wherein the substrate support includes a plurality of zones and the first temperature of the substrate support corresponds to respective temperatures in each of the plurality of zones.

3. The temperature controller of claim 2, wherein the second temperature of the substrate corresponds to a plurality of substrate temperatures, and wherein the plurality of substrate temperatures corresponds to the plurality of zones of the substrate support.

4. The temperature controller of claim 3, wherein, to adjust the heat transfer gas pressure, the heat transfer gas control module is configured to adjust a plurality of pressure controllers, and wherein each of the plurality of pressure controllers corresponds to one of the plurality of zones of the substrate support.

5. The temperature controller of claim 1, wherein the desired third temperature of the substrate corresponds to a recipe setpoint.

6. The temperature controller of claim 1, wherein the temperature calculation module is configured to receive the desired third temperature from a user interface.

7. The temperature controller of claim 1, wherein the temperature calculation module is configured to provide the second temperature of the substrate to a display.

8. The temperature controller of claim 1, wherein the temperature control model is configured to calculate the heat transfer gas pressure based on a relationship between a controlled heat transfer gas pressure and an actual heat transfer gas pressure between the substrate and the substrate support.

9. The temperature controller of claim 8, wherein, to calculate the second temperature of the substrate, the temperature calculation module is configured to (i) using the heat transfer gas pressure model, calculate the actual heat transfer gas pressure based on the controlled heat transfer gas pressure and (ii) calculate the second temperature of the substrate based on the actual heat transfer gas pressure and the first temperature of the substrate support.

10. The temperature controller of claim 1, wherein, to calculate the second temperature of the substrate, the temperature calculation module is configured to (i) receive the heat transfer gas pressure from a pressure sensor arranged within the substrate support and (ii) calculate the second temperature of the substrate based on the heat transfer gas pressure received from the pressure sensor.

11. A method for controlling temperature of a substrate support in a substrate processing system, the method comprising:
    storing, in memory, a temperature control model that correlates a heat transfer gas pressure and a first temperature of a substrate support to a second temperature of a substrate arranged on the substrate support;
    storing, in the memory, a heat transfer gas pressure model which correlates an input pressure to the heat transfer gas pressure based on heat transfer gas flows within the substrate support;
    calculating the heat transfer gas pressure using the heat transfer gas pressure model;
    calculating the second temperature of the substrate using the heat transfer gas pressure, the first temperature of the substrate support, and the temperature control model; and
    adjusting the heat transfer gas pressure based on the calculated second temperature of the substrate and a desired third temperature of the substrate.

12. The method of claim 11, wherein the substrate support includes a plurality of zones and the first temperature of the substrate support corresponds to respective temperatures in each of the plurality of zones.

13. The method of claim 12, wherein the second temperature of the substrate corresponds to a plurality of substrate temperatures, and wherein the plurality of substrate temperatures corresponds to the plurality of zones of the substrate support.

14. The method of claim 13, wherein adjusting the heat transfer gas pressure includes adjusting a plurality of pressure controllers, and wherein each of the plurality of pressure controllers corresponds to one of the plurality of zones of the substrate support.

15. The method of claim 11, wherein the desired third temperature of the substrate corresponds to a recipe setpoint.

16. The method of claim 11, further comprising receiving the desired third temperature from a user interface.

17. The method of claim 11, further comprising providing the second temperature of the substrate to a display.

18. The method of claim 11, further comprising calculating the heat transfer gas pressure based on a relationship between a controlled heat transfer gas pressure and an actual heat transfer gas pressure between the substrate and the substrate support.

19. The method of claim 18, wherein calculating the second temperature of the substrate includes (i) using the heat transfer gas pressure model, calculating the actual heat transfer gas pressure based on the controlled heat transfer gas pressure and (ii) calculating the second temperature of the substrate based on the actual heat transfer gas pressure and the first temperature of the substrate support.

20. The method of claim 11, wherein calculating the second temperature of the substrate includes (i) receiving the heat transfer gas pressure from a pressure sensor arranged within the substrate support and (ii) calculating the second temperature of the substrate based on the heat transfer gas pressure received from the pressure sensor.

\* \* \* \* \*